(12) United States Patent
Kudo et al.

(10) Patent No.: US 12,368,838 B2
(45) Date of Patent: Jul. 22, 2025

(54) VEHICULAR DEVICE AND METHOD FOR THE SAME

(71) Applicant: DENSO CORPORATION, Kariya (JP)

(72) Inventors: Akira Kudo, Kariya (JP); Takahiro Tsuduki, Kariya (JP)

(73) Assignee: DENSO CORPORATION, Kariya (JP)

( * ) Notice: Subject to any disclaimer, the term of this patent is extended or adjusted under 35 U.S.C. 154(b) by 27 days.

(21) Appl. No.: 18/336,593

(22) Filed: Jun. 16, 2023

(65) Prior Publication Data

US 2023/0328224 A1 Oct. 12, 2023

Related U.S. Application Data

(63) Continuation of application No. PCT/JP2021/043210, filed on Nov. 25, 2021.

(30) Foreign Application Priority Data

Dec. 23, 2020 (JP) ................................. 2020-213696

(51) Int. Cl.
*H04N 17/00* (2006.01)
*H03M 13/00* (2006.01)
*H03M 13/09* (2006.01)

(52) U.S. Cl.
CPC ............ *H04N 17/00* (2013.01); *H03M 13/09* (2013.01); *H03M 13/611* (2013.01)

(58) Field of Classification Search
CPC ......... H04N 17/00; H04N 7/18; H03M 13/09; H03M 13/611

USPC .................................................... 348/180, 148
See application file for complete search history.

(56) References Cited

U.S. PATENT DOCUMENTS

| | | | | |
|---|---|---|---|---|
| 8,418,024 B2* | 4/2013 | You | ...................... | H04L 1/0065 |
| | | | | 714/758 |
| 11,368,471 B2* | 6/2022 | Yi | ........................... | H04L 12/40 |
| 11,442,806 B2* | 9/2022 | Takano | .................. | B60K 35/60 |
| 2019/0181982 A1 | 6/2019 | Hardacker et al. | | |

FOREIGN PATENT DOCUMENTS

JP 2010060711 A 3/2010
JP 6434840 B2 12/2018

* cited by examiner

*Primary Examiner* — Trang U Tran
(74) *Attorney, Agent, or Firm* — Harness, Dickey & Pierce, P.L.C.

(57) ABSTRACT

A vehicular device of an embodiment includes a control unit that executes processing related to displaying on a meter display, an video processing unit that generates a video to be displayed, a video output unit that outputs the generated video, a ROM that stores a telltale image that is a basis of the video to be generated and a CRC master as an error detection code that has been calculated from the telltale image, a CRC calculation unit that calculates the error detection code, and a video error detection unit that detects an error in the video output to the meter display by comparing an HW-CRC, which is an error detection code calculated from the video output from the video output unit, with the CRC master stored in the ROM.

8 Claims, 9 Drawing Sheets

VEHICULAR DEVICE AND METHOD FOR THE SAME

CROSS REFERENCE TO RELATED APPLICATIONS

This application is a continuation application of International Patent Application No. PCT/JP2021/043210 filed on Nov. 25, 2021, which designated the U.S. and claims the benefit of priority from Japanese Patent Application No. 2020-213696 filed on Dec. 23, 2020. The entire disclosure of all of the above applications is incorporated herein by reference.

TECHNICAL FIELD

The present disclosure relates to a vehicular device that detects an error in output video and a method for detecting an error in the output video.

BACKGROUND ART

A vehicular device installed in a vehicle is required to operate with accuracy because it may perform processing related to safety. For this reason, it has been proposed to check whether the processes are performed in a predetermined execution order by performing error detection on the execution order of the programs.

SUMMARY

In one aspect of the present disclosure, a vehicular device includes: a control unit executing a process related to displaying on a display device; a video processing unit generating a video to be displayed on the display device; a video output unit outputting the video generated by the video processing unit to the display device; a storage unit storing an image that is a basis of the video generated by the video processing unit and an error detection code that has been calculated from the image; a calculation unit calculating the error detection code; and a video error detection unit detecting an error in the video output to the display device by comparing the error detection code calculated from the video output from the video output unit with the error detection code stored in the storage unit.

BRIEF DESCRIPTION OF THE DRAWINGS

Objects, features and advantages of the present disclosure become more apparent from the following detailed description made with reference to the accompanying drawings.

DETAILED DESCRIPTION OF EMBODIMENTS

Figure 1:
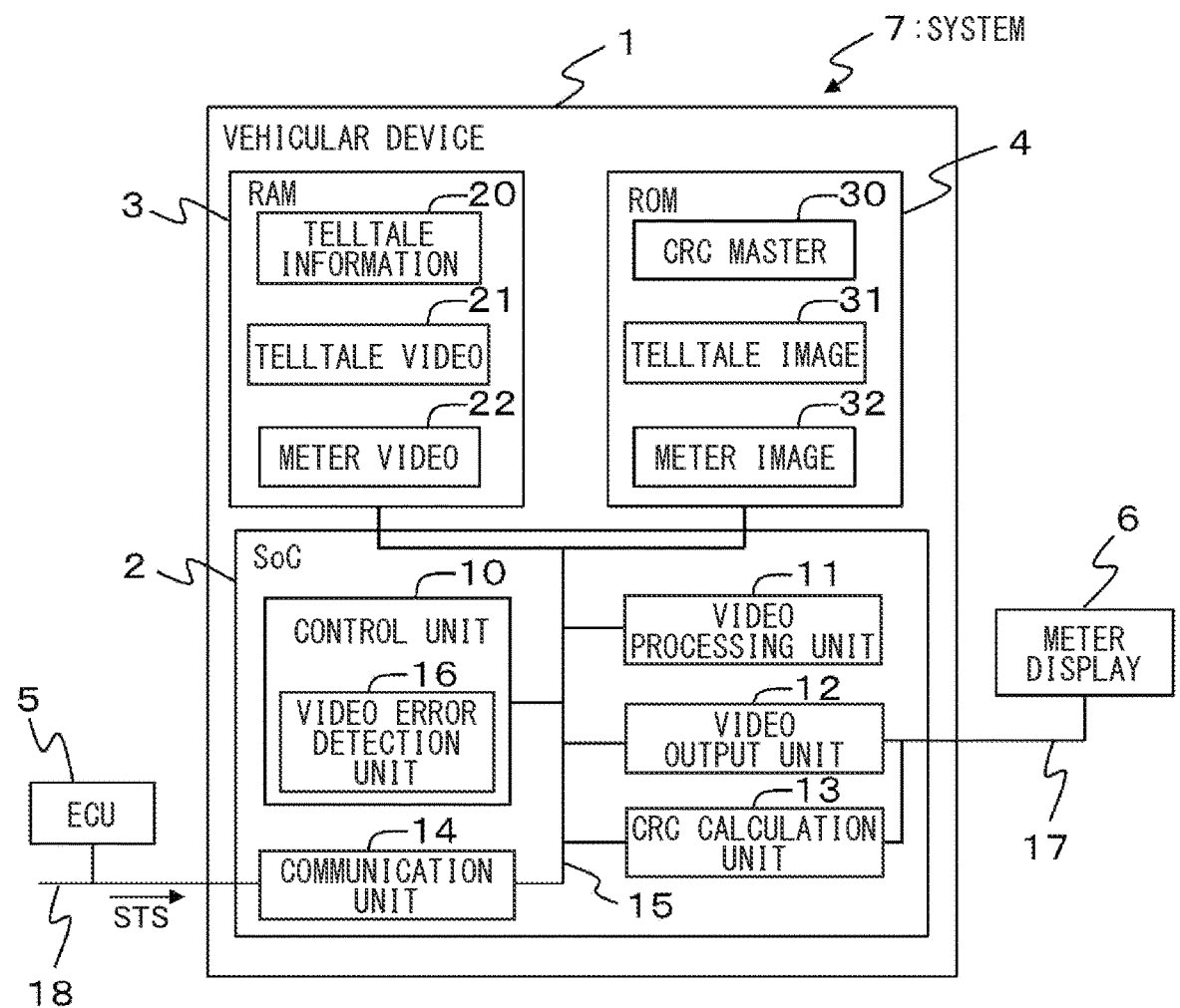
FIG. 1 is a diagram schematically showing a configuration example of a vehicular device according to a first embodiment.

To begin with, a relevant technology will be described first only for understanding the following embodiments. In recent years, the vehicular device has been equipped with a display device such as a liquid crystal panel on an instrument panel, and full graphics display of telltales that warn of (a) failure of vehicle functions such as speedometers, airbags brakes, and the like, and (b) non-use of seatbelts, and the like.

In such case, in order to realize so-called functional safety, regarding the display of the telltale, for example, a safety goal is set, which may be "If a vehicle function does not operate due to a failure, the telltale is lit so that the occupants can recognize the inoperability." and the like. Vehicular devices are required to be designed to achieve such a safety goal. The safety goal may hereinafter be referred to as SG (Safety Goal).

However, when a video is output from a vehicular device, even if a correct processing is executed in a correct order, it is assumed, in a certain situation, that the video generated based on the execution result is not necessarily correct.

For example, a vehicular device generally stores an image from which a video is generated, and generates and outputs a video based on such an image. In reality, if the original image is damaged due to, for example, a soft error, the video is generated based on the damaged image even if the correct processing is executed in the correct order. As a result, for example, a safety unachieved state, in which no warning is displayed in spite of a situation in which a warning should be displayed, that is, a state in which the set safety goal cannot be achieved, may occur.

It is one of objectives of the present disclosure, made in view of the circumstances described above, to provide a vehicular device capable of detecting an error in a video output therefrom.

In a first aspect of the present disclosure, a vehicular device includes: a control unit executing a process related to displaying on a display device; a video processing unit generating a video to be displayed on the display device; a video output unit outputting the video generated by the video processing unit to the display device; a storage unit storing an image that is a basis of the video generated by the video processing unit and an error detection code that has been calculated from the image; a calculation unit calculating the error detection code; and a video error detection unit detecting an error in the video output to the display device by comparing the error detection code calculated from the video output from the video output unit with the error detection code stored in the storage unit.

In a second aspect of the present disclosure, a vehicular device includes: at least one processor; and at least one memory storing a program. By executing the program stored in the at least one processor, the at least one processor is configured to: execute a process related to displaying on a display device; generate a video to be displayed on the display device; output the generated video to the display device; store an image that is a basis of the generated video and an error detection code that has been calculated from the image; calculate the error detection code from the video output to the display device; and compare the calculated error detection code with the stored error detection code to detect an error in the video output to the display device.

In a third aspect of the present disclosure, a method includes: executing a process related to displaying on a display device; generating a video to be displayed on the display device; outputting the generated video to the display device; storing an image that is a basis of the generated video and an error detection code that has been calculated from the image; calculating the error detection code from the video output to the display device; and comparing the calculated error detection code with the stored error detection code to detect an error in the video output to the display device.

According to the above-described aspects, the vehicular device can compare the respective error detection codes, and, if the two codes match, it can be confirmed that the output video is correctly generated based on the original image. On the other hand, if the two codes do not match, it can be confirmed that the output video is different from the original image. In addition, since error detection is performed on the video in a final stage of processing by the vehicular device, it is possible to detect any defect that occurs at any point in the processing regarding display of the video on the display device. Therefore, it is possible to detect errors in the video output therefrom.

Hereinafter, embodiments of the present disclosure are described. Moreover, the same symbol shall be attached to the substantially same part in each embodiment.

First Embodiment

The first embodiment is described in the following. As shown in FIG. 1, a vehicular device 1 includes an SoC 2, a RAM 3, a ROM 4, and the like. This vehicular device 1 constitutes a video error detection system 7 together with another ECU 5 mounted on the vehicle and a meter display 6 as a display device. SoC is an abbreviation of System on a Chip, and ECU is an abbreviation of Electronic Control Unit. Although the vehicular device 1 is, itself, a type of the ECU 5, the vehicular device 1 and the ECU 5 are distinguished for the sake of ease of understanding of the following description.

The SoC 2 is a semiconductor integrated circuit packing a control unit 10, a video processing unit 11, a video output unit 12, a CRC calculation unit 13, a communication unit 14, etc. in a package. The control unit 10 is composed of a processor (not shown), and is connected to the RAM 3, the ROM 4, the video processing unit 11, the video output unit 12, the CRC calculation unit 13, and the communication unit 14 via an internal bus 15. This control unit 10 controls the entire vehicular device 1 by executing a program. Further, the control unit 10 executes various software processes for outputting a video to the meter display 6 in relation to the present embodiment. Here, the "video" in the present disclosure includes not only dynamic images (movies) to be displayed or being displayed on the meter display but also an image to be or being displayed on the meter display.

A video error detection unit 16 is implemented in the control unit 10 by software. The video error detection unit 16 detects errors in the video output to the display device, details of which is described later. In addition, the video error detection unit 16 compares an error detection code calculated for the video output from the video output unit 12 with an error detection code stored in the ROM 4, thereby detecting errors in the output video, which is output to the meter display 6.

The RAM 3 is implemented by a volatile storage device such as a DDR memory. DDR is an abbreviation of Double Data Rate. The RAM 3 temporarily stores various data relating to the processing executed by the control unit 10, as well as telltale information 20 indicating a lit state of the telltale, a telltale video 21 to be displayed on the meter display 6, which is described in detail later, a meter video 22, and the like. The telltale video 21 and the meter video 22 are drawn in a drawing area provided in advance in the RAM 3 and stored in the RAM 3.

The ROM 4 is realized by a non-volatile storage device such as so-called FlashROM, eMMC, UFS, or the like. This ROM 4 constitutes a storage unit in the present embodiment. Note that eMMC is an abbreviation of embedded Multi Media Card, and UFS is an abbreviation of Universal Flash Storage.

The ROM 4 stores a program executed by the control unit 10, a CRC master 30 which is an error detection code, a telltale image 31 which is a basis of the telltale video 21 displayed on the meter display 6, a meter image 32 which is a basis of the meter video 22, and the like. The CRC master 30 is an error detection code calculated in advance for the telltale image 31 and stored in the ROM 4 in advance, although the details are described later. Note that CRC is an abbreviation of Cyclic Redundancy Check.

Figure 2:
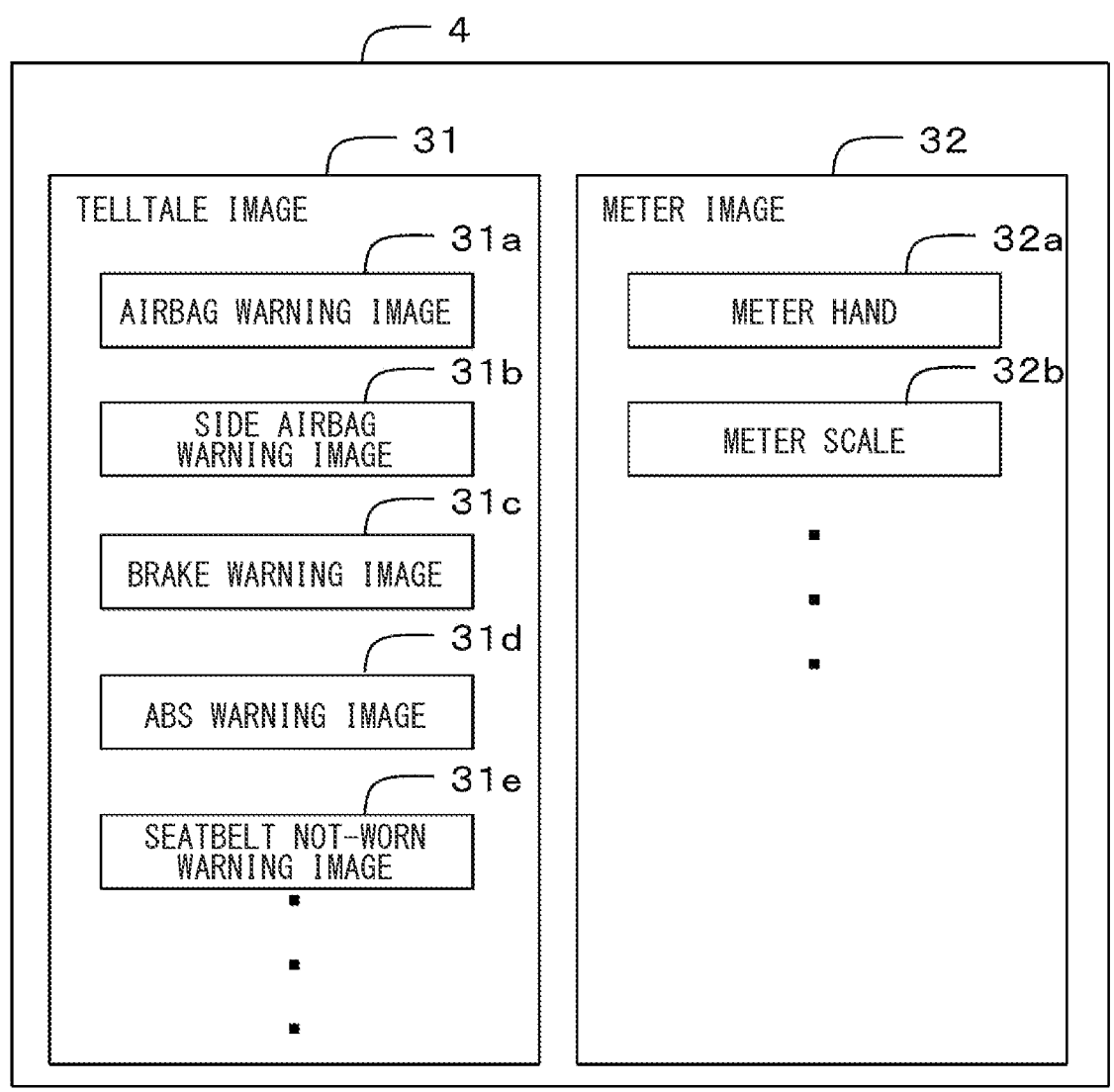
FIG. 2 is a diagram schematically showing an example of a telltale image.

Specifically, as shown in FIG. 2, the telltale image 31 includes, for example, an airbag warning image 31a, a side airbag warning image 31b, a brake warning image 31c, an ABS warning image 31d, a seatbelt not-worn warning image 31e, and the like. is stored. However, the number and types of telltale images 31 shown in FIG. 2 are example only, and standard images in compliance to the relevant rules, regulations and standards are available, such as the one issued by the Traffic Regulation Authority regarding a manually-operated device in a vehicle, and a position and recognition of a telltale and an indicator. Further, as the meter image 32, for example, images such as a meter hand 32a and a meter scale 32b are stored in the ROM 4.

These images are processed by the video processing unit 11. Specifically, upon receiving an instruction from the control unit 10, the video processing unit 11 reads the telltale image 31 and the meter image 32 stored in the storage unit, and then stores them in the drawing area set in the RAM 3 as the telltale video 21 and the meter video 22. In the present embodiment, parts stored in the ROM 4 and used to generate a video are referred to as an image or images, and the parts redrawn in the drawing area after adjustments of the size and position for the display on the meter display 6 are referred to as a video or videos.

The telltale video 21 and the meter video 22 drawn in the drawing area are output to the meter display 6 by the video output unit 12. Specifically, the video output unit 12 receives an instruction from the control unit 10, reads the telltale video 21 and the meter video 22 drawn in the drawing area in the RAM 3, and outputs, to the meter display 6, a composed video composed from those videos 21, 22.

After being converted into a video signal, the composed video is transmitted and displayed on the meter display 6 via a video cable 17. In other words, the composed video output from the video output unit 12 is processed in the final stage in the vehicular device 1. Then, as is described later, the CRC calculation unit 13 performs CRC calculation on this composed video. Hereinafter, the composed video output from the video output unit 12 may also be simply referred to as the video output from the video output unit 12.

In the present embodiment, the video processing unit 11 and the video output unit 12 use a GPU and an IPU built in the SoC 2, but the video processing unit 11 and the video output unit 12 may be configured as the same module. Note that GPU is an abbreviation of Graphics Processing Unit, and IPU is an abbreviation of Image Processing Unit.

The CRC calculation unit 13 performs CRC calculation on the input data, and, in regards to the present embodiment, performs CRC operation on the video output from the video output unit 12, that is, on the composed image composed by the video output unit 12. The CRC calculation unit 13 constitutes a calculator for calculating an error detection code.

The communication unit 14 performs communication between the SoC 2 and external devices. In the present embodiment, the communication unit 14 is configured to be capable to receive a vehicle status indicated as STS in FIG. 1 via an in-vehicle network 18. This vehicle status includes information that can identify a state of a vehicle, and information that is necessary for displaying on the meter display 6 the telltale information 20 indicating whether or not to light the telltale, the speed of the vehicle, the number of engine revolutions, and the like. Also, the vehicle status is stored in the RAM 3 by processing of the control unit 10.

However, the communication unit 14 may be arbitrarily configurable as long as it has a bandwidth capable of communicating the vehicle status at required intervals to obtain/update. Alternatively, a communication circuit for CAN or LIN may be externally connected to the SoC 2, and a communication system such as SPI, I2C, or RS232C may be used to connect between them. Note that CAN is an abbreviation of Controller Area Network, LIN is an abbreviation of Local Interconnect Network, SPI is an abbreviation of Serial Peripheral Interface, and I2C is an abbreviation of Inter-Integrated Circuit.

The ECU 5 performs various controls related to the functions of the vehicle, and although only one ECU 5 is shown in FIG. 1 for simplification of explanation, a plurality of ECUs are actually mounted on the vehicle. The ECU 5 includes, for example, airbag control, engine control, brake control, power steering control, charging control, transmission control and the like. In the present embodiment, the ECU 5 is configured to be capable to obtain a vehicle status and transmit it to the vehicular device 1, for a determination of whether or not the vehicle is in a state in which the telltale should be lit.

The meter display 6 is composed of, for example, a liquid crystal display or an organic EL display, and is provided on an instrument panel at a position substantially in front of a driver. The meter display 6 is connected to the vehicular device 1 via the video cable 17, and displays the video output from the video output unit 12 of the vehicular device 1. Hereinafter, the composed video output by composing the telltale video 21 and the meter video 22, that is, the video displayed on the meter display, may simply be referred to as the telltale.

Figure 3:
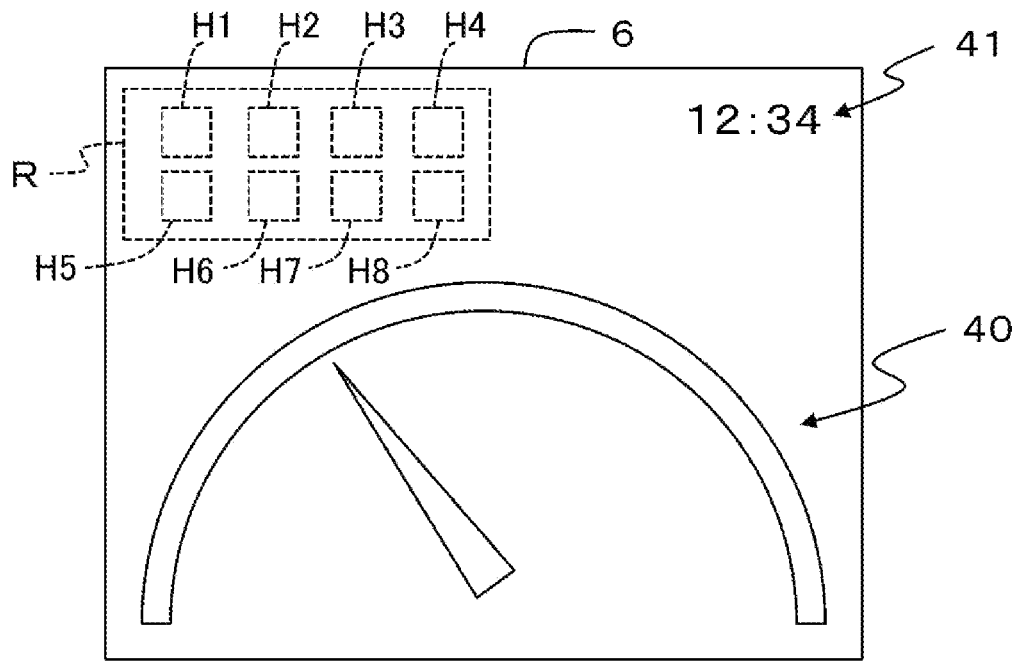
FIG. 3 is a diagram schematically showing an example of display on a meter display.
Figure 3:
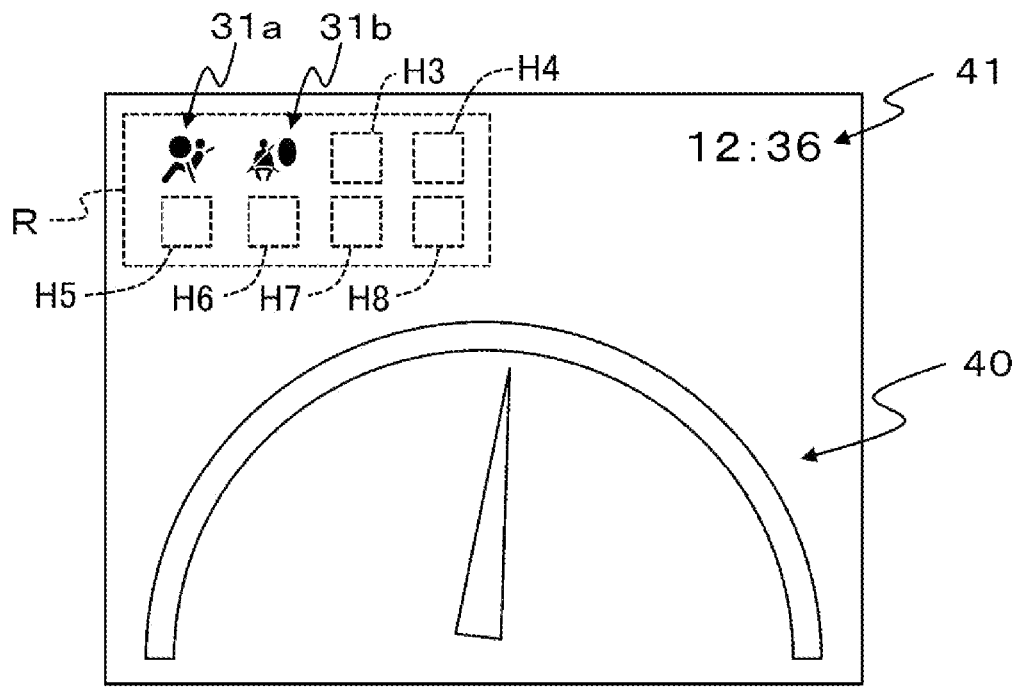

As shown in FIG. 3, the meter display 6 displays a speedometer 40, a current time 41, and a plurality of telltales warning of (i) failure of vehicle functions such as airbags and brakes, (ii) seatbelt not-worn, and the like. It should be noted that FIG. 3 is an example of the meter display 6, which may also be configured to display a rotation speed meter and/or other information.

The telltale to be displayed is located at a predetermined position within a display area (R), and at a predetermined position assigned for each of various types of telltales, and has a predetermined size or more predetermined for warning, as full graphics display in color. In FIG. 3, eight display positions H1 to H8 are set in the display area (R), and an individual telltale is assigned in advance to each of those display positions. Each telltale is set to be lit or unlit so as to have a preset display mode according to the state of the vehicle. Note that the above-described positions and number of telltales to be displayed are examples.

For example, in the display example shown in FIG. 3: NO WARNING, the telltale is unlit at each display position because no defect requiring the telltale to be lit has been detected and no warning is required. On the other hand, in the display example shown in FIG. 3: WARNING PROVIDED, a defect has been detected in the airbag and the side airbag, and since it is necessary to warn them, a telltale video 21*a* for warning the defect of the airbag is displayed in a lit state at the predetermined display position (H1), for example, and a telltale video 21*b* for warning the defect of the side airbag is displayed in a lit state at a pre-assigned display position (H2), for example.

Here, the lit state means a state in which the telltale is displayed on the meter display 6 in a color and size determined for warning, and the unlit state means a state in which the telltale is not displayed on the meter display 6 or a state displayed on the meter display 6 in a manner different from the lit state. To put it more simply, the lit state is a state in which a warning display is displayed in a display mode predetermined by laws and regulations, and the unlit state is a state of a non-warning display, that is, a state in a display mode different from the warning display.

Therefore, the unlit state includes, for example, a state in which only an outer edge is displayed faintly to an extent that the position where the telltale is displayed can be grasped, a state in which the position is displayed in a color such as light white or gray that is different from the color specified for warning, or a state in which the position is displayed in a color suggesting that no defect is occurring. Further, for the display of the telltale in the unlit state in the above-described manner, the telltale image 31 in the lit state and the telltale image 31 in the unlit state are prepared and stored in advance in the ROM 4, and appropriate one(s) is/are selected from the prepared images according to the state of the vehicle.

Figure 4:
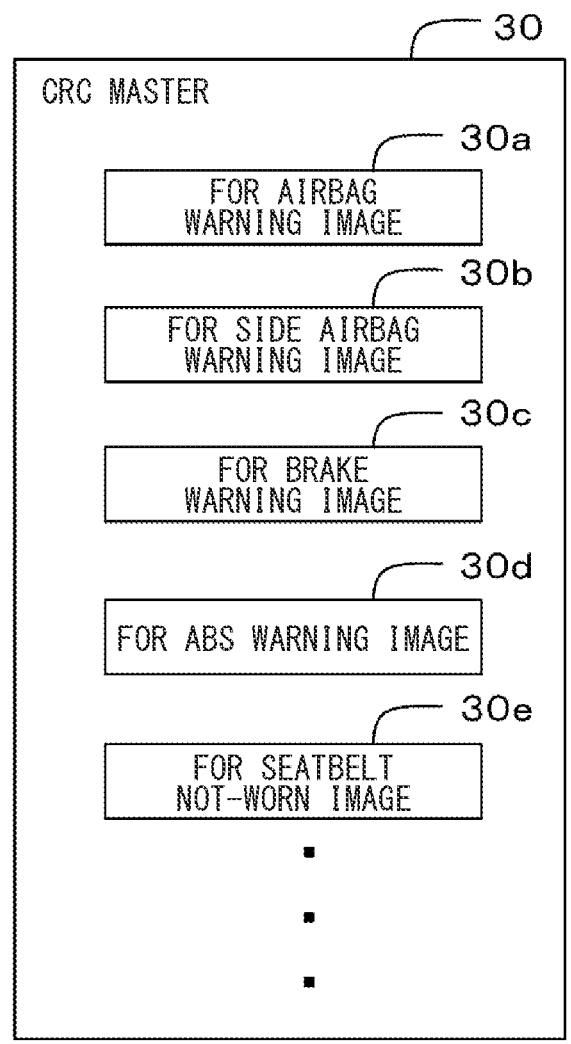
FIG. 4 is a diagram schematically showing an example of a CRC master.

For the telltale image 31 stored in the ROM 4, an error detection code is obtained in advance by CRC calculation and stored in the ROM 4 as a CRC master 30. In the present embodiment, the ROM 4 stores a plurality of CRC masters 30, which are error detection codes pre-calculated for individual telltale images 31, as shown in FIG. 4. The telltale image 31 is generated by, for example, a computer for development and stored in the ROM 4, thereby a CRC master 30 is calculated for a telltale image 31 in advance, i.e., before the telltale image 31 is stored in the ROM 4.

The CRC master 30 stores, for example, a CRC master 30*a* calculated for the airbag warning image 31*a*, a CRC master 30*b* calculated for the side airbag warning image 31*b*, and a CRC master 30*c* calculated for the brake warning image 31*c*, a CRC master 30*d* calculated for the ABS warning image 31*d*, a CRC master 30*e* calculated for a seatbelt not-worn warning image 31*e*, and the like.

These CRC masters 30 are stored in association with the original telltale images 31 respectively. Although not shown in FIG. 4, the CRC masters 30 calculated for other required telltale images 31 are also stored in association with the original telltale images 31, in the actual system.

The correctness of the output video is verified by comparing (a) the CRC master 30 corresponding to the actual vehicle state with (b) the error detection code for the actually output telltale video 21. In other words, using the CRC master 30 makes it possible to verify (i) whether the telltales are displayed correctly and (ii) whether the display state of each telltale matches the vehicle status.

Next, an operation of the above-described configuration is described. As mentioned above, in case of full graphics display of telltales that warn of failure of vehicle functions such as airbags, brakes, not-worn seatbelts, and the like, for realizing so-called functional safety that conforms to the international standard ISO26262, for example, safety goals are set to avoid or mitigate the effects of possible defect.

The ISO26262 proposes ASIL as an index for evaluating defects, that is, hazards. ASIL classifies hazards according to severity, hazard occurrence frequency, avoidability, and the like, and requires product development suitable for each class at a design level. ASIL stands for Automotive Safety Integrity Level.

In addition, the vehicular device 1 is required to be designed so as to achieve safety goals. Specifically, for the SoC 2 used in the vehicular device 1 of the present embodiment, a device corresponding to the required ASIL class is selected. Hereinafter, the safety goal is referred to as SG, a state in which SG is achieved is referred to as SG non-violation, and a state in which SG cannot be achieved is referred to as SG violation.

Here, an example of SG, when the telltale is displayed in full graphics as in the present embodiment, may be, for example, set as a system that "lights a telltale to notify an occupant of a failure when a vehicle function does not operate due to a failure." In such case, an example of a state of SG violation may include (a) a state, in which, although a speedometer or the like is displayed and the display of the meter display 6 appears to be operating normally, the telltale is in the unlit state when it should be in the lit state, and (b) a state in which the telltale is in the lit state when it should be in the unlit state.

However, when a video is output from the vehicular device 1, even if the correct processing is executed in the correct order, it is assumable, in a certain situation, in which the video generated based on the execution result is not necessarily correct. In other words, it is assumed that an error occurs in the video before the video is output to a transmission path such as the video cable 17, which is generally considered to be affected by noise.

Specifically, the vehicular device 1 stores in the ROM 4 an image that is the basis of the video to be generated, and generates and outputs the video based on such an image. At this time, if the original image is damaged due to, for example, a soft error, a video is generated based on the damaged image even if the correct processing is executed in the correct order. That is, a situation occurs in which the video generated based on the execution result is not correct.

As a result, for example, SG violation occurs, such as (a) the telltale is not displayed even though it should be displayed in a lit state, (b) the telltale is displayed even though it should not be displayed, (c) the telltale is different from the one that should be displayed, or the like.

Figure 5:
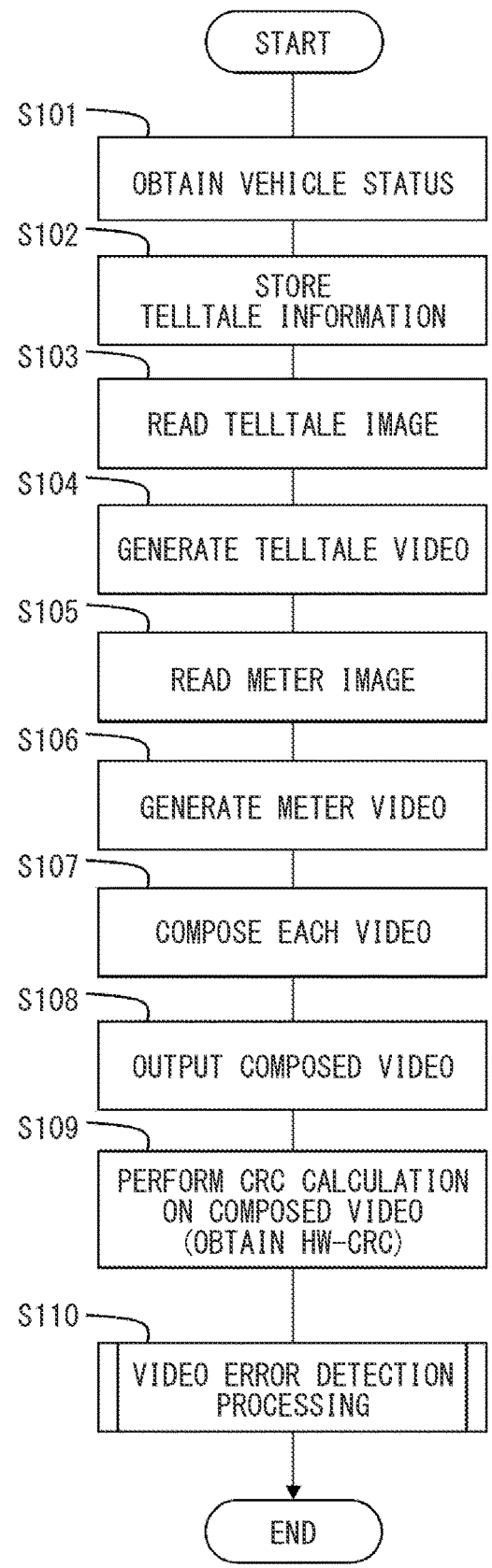
FIG. 5 is a diagram showing a flow of video display processing.
Figure 6:
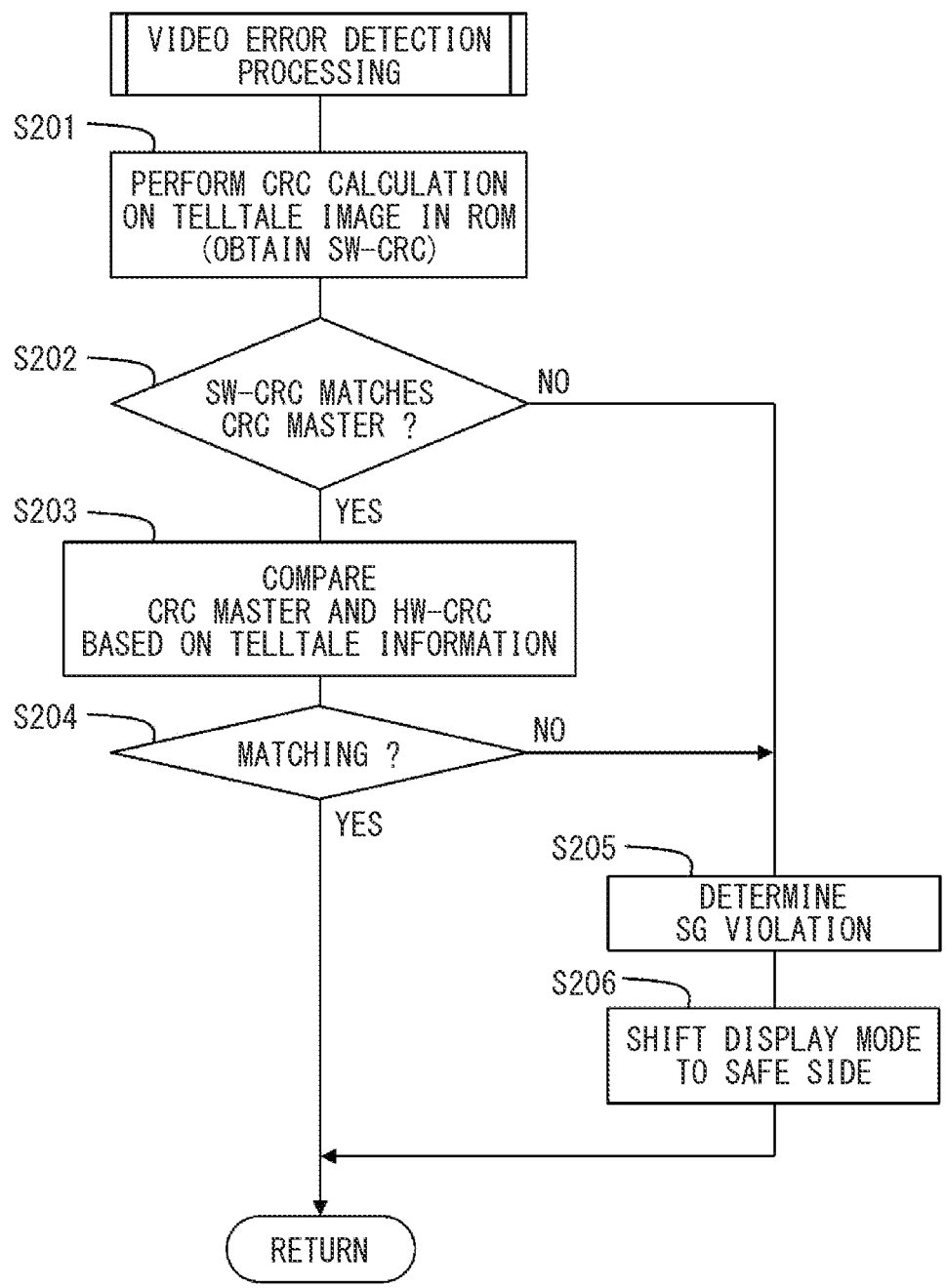
FIG. 6 is a diagram showing a flow of video error detection processing.

Therefore, the vehicular device 1 detects an error that may cause SG violation in the video output therefrom by executing (a) the display processing shown in FIG. 5 and (b) the video error detection processing shown in FIG. 6. Although each processing described below is executed by the control unit 10, the video processing unit 11, the video output unit 12, the CRC calculation unit 13, and the communication unit 14, the vehicular device 1 is mainly described.

In the display processing shown in FIG. 5, the vehicular device 1 first obtains a vehicle status from the ECU 5 (S101), and stores telltale information 20 included in the obtained vehicle status in the RAM 3 (S102). At this time, the vehicular device 1 obtains and stores vehicle information such as a vehicle speed and an engine rotation number from the vehicle status in order to generate the meter video 22. These processes are performed by the control unit 10 and the communication unit 14.

Subsequently, the vehicular device 1 reads a telltale image 31 from the ROM 4 based on the telltale information 20 (S103), and generates a telltale video 21 in the RAM 3 (S104). At this time, in the vehicular device 1, an instruction to generate a telltale video 21 is given from the control unit 10 to the video processing unit 11, and the video processing unit 11 receiving the instruction reads the telltale image 31 from the ROM 4, and generates a telltale video 21 by (i) setting the lit state or unlit state of each telltale based on the information 20 and (ii) drawing it in a predetermined size and color in the drawing area in the RAM 3.

A drawing area for drawing the meter video 22 and a drawing area for drawing the meter video 22 are individually provided in the RAM 3 like a so-called layer structure. Further, the processing of steps S103 and S104 and the processing of steps S105 and S106, which is described later, can be instructed in random order or at the same time.

The vehicular device 1 also reads the meter image 32 from the ROM 4 based on the vehicle information (S105), and generates the meter video 22 in the RAM 3 (S106). At this time, in the vehicular device 1, an instruction to generate the meter video 22 is given from the control unit 10 to the video processing unit 11, and the video processing unit 11 receiving the instruction generates the meter video 22 by (i) reading the image of the meter hand 32a and the meter scale 32b from the ROM 4, (ii) setting the direction of the hand and the like based on the vehicle information, and (iii) drawing them in the drawing area in the RAM 3.

Subsequently, the vehicular device 1 composes each video to generate a composed video (S107), outputs it to the display device (S108), and performs CRC calculation on the composed video (S109). Hereinafter, the error detection code calculated by the CRC calculation unit 13 on the video output from the video output unit 12 is referred to as HW-CRC for convenience. Note that HW is an abbreviation of hardware.

At this time, the vehicular device 1 performs CRC calculation on an area where the telltale video 21 is displayed in the composed video. In other words, when the meter display 6 displays other information such as a speedometer, the vehicular device 1 narrows down a range to be subjected to error detection.

Then, the vehicular device 1 performs video error detection processing (S110). This video error detection processing is executed by the video error detection unit 16. Note that, in the present embodiment, in addition to the fact that the hardware design of the vehicular device 1 is of high quality in the first place, in view of the fact that the probability of actual occurrence of a defect caused by a soft error is rare, a video display is prioritized and thereafter performing video error detection processing, for a verification of the video. However, it is also possible to adopt a configuration in which the composed video is first subjected to video error detection processing to verify its correctness, and then the verified composed video is output.

The vehicular device 1 performs CRC calculation on the telltale image 31 in the ROM 4 in the video error detection processing shown in FIG. 6 (S201). At this time, the vehicular device 1 identifies a necessary telltale image 31 based on the telltale information 20, reads the identified telltale image 31 from the ROM 4, and performs CRC calculation. In other words, in the present embodiment, the error detection code that serves as a reference for error detection is not stored in the RAM 3 but in the ROM 4 in advance. Hereinafter, the error detection code calculated by the CRC calculation unit 13 on the telltale image 31 read out from the ROM 4 is referred to as SW-CRC for convenience. Note that SW is an abbreviation of Software.

Then, the vehicular device 1 compares the obtained SW-CRC with the corresponding image CRC master 30, and determines whether or not they match (S202). That is, the vehicular device 1 reads from the ROM 4 (*a*) the SW-CRC and (b) the CRC master 30 associated with the telltale image 31 on which the SW-CRC has been calculated, and compares the two. By comparing the SW-CRC and the CRC master 30 in such manner, the correctness of both the telltale image 31 read from the ROM 4 and the CRC master 30 can be verified.

That is, if the SW-CRC and the CRC master 30 match, it means that the telltale image 31 and the CRC master 30 stored in the ROM 4 are correct, and it ultimately guarantees reliability of verification results of the telltale video 21 using them.

On the other hand, if the SW-CRC and the CRC master 30 do not match, it means that at least one of the telltale image 31 and the CRC master 30 has an error, that is, it is in a situation that correctness of the generated telltale video 21 is not verifiable. In such case, for example, it may be assumed that the telltale video 21 has no error, and the CRC master 30 is erroneous, and the generated telltale video 21 is correct. However, correctness of the above determination is not verifiable, it is determined by the vehicular device 1 as SG violation.

Therefore, when the SW-CRC and the CRC master 30 do not match (S202: NO), the vehicular device 1 determines SG violation (S205), and shifts the display mode to the safe side (S206). In the present embodiment, the vehicular device 1 shifts the display mode to the safe side by resetting itself or by stopping the output of the video to the meter display 6. In other words, the vehicular device 1 avoids SG violation by preventing display of erroneous telltales.

When the vehicular device 1 is reset or the video output is stopped, the meter display 6 is put in a state in which nothing is displayed thereon. However, it is possible for an occupant of the vehicle, from such a state, to grasp the situation where a failure/abnormality is occurring, and to take measures such as stopping the vehicle or the like. Also, in such case, the vehicular device 1 is configured to stop an erroneous video, i.e., preventing continued display of an erroneous video, even in case that it may have been displayed for a short time.

In other words, in the present embodiment, it is based on an idea that, compared to a state of SG violation, for example, in which an airbag malfunction is left unwarned in spite thereof, no display state (i.e., nothing is displayed) on the meter display 6 is on a safer side. However, this configuration for shifting to the safe side is an example, and other configurations are possible as long as the state of SG violation can be suppressed.

On the other hand, when the SW-CRC and the CRC master 30 match (S202: YES), the vehicular device 1 compares (a) the CRC master 30 whose correctness has been verified based on the telltale information 20 and (b) the HW-CRC (S203), and determines whether the CRC master 30 and the HW-CRC match (S204). Although illustration is omitted, at this time, the vehicular device 1 compares the display content of the output video with the state of the vehicle by comparing the CRC master 30 and the SW-CRC for each telltale. In other words, the vehicular device 1 detects an error in which the display content of the output video and the state of the vehicle do not match.

Then, if the comparison result does not indicate matching for any of the telltales (S204: NO), the vehicular device 1 determines that SG violation has occurred (S205), and shifts the display mode to the safe side (S206). This is based on an idea that unmatching comparison result is caused by (a) a state in which, for example, the telltale image 31 stored in the RAM 3 is damaged and the telltale video 21 is erroneous because it is generated based on the damaged telltale image 31, or (b) a state in which the telltale is not displayed according to the vehicle status.

Note that if the telltale image 31 stored in the ROM 4 is damaged, the HW-CRC of the video generated based on the damaged image will not match the CRC master 30, thereby video errors are similarly detectable. In other words, an error can be detected by comparing the display mode of the telltale in the output video and the state of the vehicle.

On the other hand, if the comparison result for each of the telltales indicates matching (S204: YES), which verifies or indicates that the correct telltale video 21 is generated and each of the telltales is displayed in accordance with the vehicle status, the vehicular device 1 determines that it is not SG violation and returns. In such case, it is guaranteed that the composed video satisfies SG.

Then, after returning from the image error detection processing, the vehicular device 1 ends the display processing as shown in FIG. 5. For the sake of explanation, the flow for ending the processing is shown here, but in reality, the display processing is repeated based on the predetermined video update timing or obtainment of the vehicle status, or, the display processing stands by, waiting for the next update.

In such manner, the vehicular device 1 performs video error detection processing on the composed video output from the video output unit 12, that is, on the data processed in the final stage of itself, thereby detecting an error leading to SG violation, and verifying the correctness of the video output therefrom.

According to the vehicular device 1 described above, following effects are achievable. The vehicular device 1 includes the control unit 10 that executes processing related to display on the display device, the video processing unit 11 that generates a video to be displayed on the display device, a video output unit 12 that outputs the video generated by the video processing unit 11 to the display device, a storage unit that stores an image that is the basis of the video generated by the video processing unit 11 and an error detection code pre-calculated for that image, a video error detection unit 16 that detects an error in the video output to the display device, by comparing the error detection code calculated for the video output from the video output unit 12 and the error detection code stored in the storage unit.

Accordingly, the vehicular device 1 can verify that the video output from itself is correctly generated based on the original image, and can detect errors in the video. At this time, the vehicular device 1 performs error detection on the composed video output from the video output unit 12, that is, the data processed in the final stage in itself, even when a failure occurs anywhere in itself, it is possible to detect an error in the video due to the failure.

Further, the vehicular device 1 verifies the correctness of both of the original image stored in the storage unit and the error detection code pre-stored in the storage unit, by storing in the storage unit the error detection code calculated for the original image and by comparing the error detection code calculated for the original image and stored in the storage unit with the error detection code calculated for the video output from the video output unit 12.

As a result, it is possible to verify the correctness of both of the image and the error detection code, which are stored in advance in the storage unit and serve as a reference for detecting errors in the video. Further, by detecting an error in the video using the error detection code that has been verified to be correct, the reliability of the detection result can be further improved.

In addition, since the error detection code that serves as a reference for error detection is stored in the ROM 4, a risk of not detecting an error in the video due to the damage of the error detection code itself is reducible compared to a configuration in which the error detection code calculated based on the telltale image 31 is stored in the RAM 3.

In addition, the vehicular device 1 detects an error in the video including the telltale, the display mode of which is predetermined according to the state of the vehicle. As a result, for example, it is possible to prevent a situation in which a warning is not displayed even though it should be displayed, that is, an error that could lead to SG violation, thereby further improving the safety and reliability of the vehicle.

In addition, the vehicular device 1 compares the display mode of the telltale in the output video and the state of the vehicle, to detect an error in which the display content of the output video and the state of the vehicle do not match. As a result, it is possible not only to detect an error in the video, but also to detect an error that the display content of the video does not match the state of the vehicle, preventing an error that could lead to SG violation, and further improving safety and reliability of the vehicle.

The vehicular device 1 also detects an error by performing a comparison for an error detection code calculated for an area where the telltale is displayed in the video output from the video output unit 12. As a result, even if other information such as a speedometer is displayed on the meter display 6, error detection can be processed at a higher speed by narrowing down an error detection target range.

Further, when detecting an error in the video, the vehicular device 1 suppresses display of the erroneous video on the display device. As a result, it is possible to prevent a state of SG violation in which a warning regarding a defect is not provided even though the defect is occurring in the vehicle function. In such case, the configuration also stops an erroneous video, i.e., prevents continued display of an erroneous video, even in case that it may have been displayed for a short time.

Second Embodiment

The second embodiment is described in the following. The second embodiment differs from the first embodiment in the configuration of the CRC master 30 for detecting video errors. However, since the main part of configuration of the vehicular device 1 and the flow of processing for detecting an error are common, the description is made with reference to FIGS. 1 to 6 as well.

Figure 7:
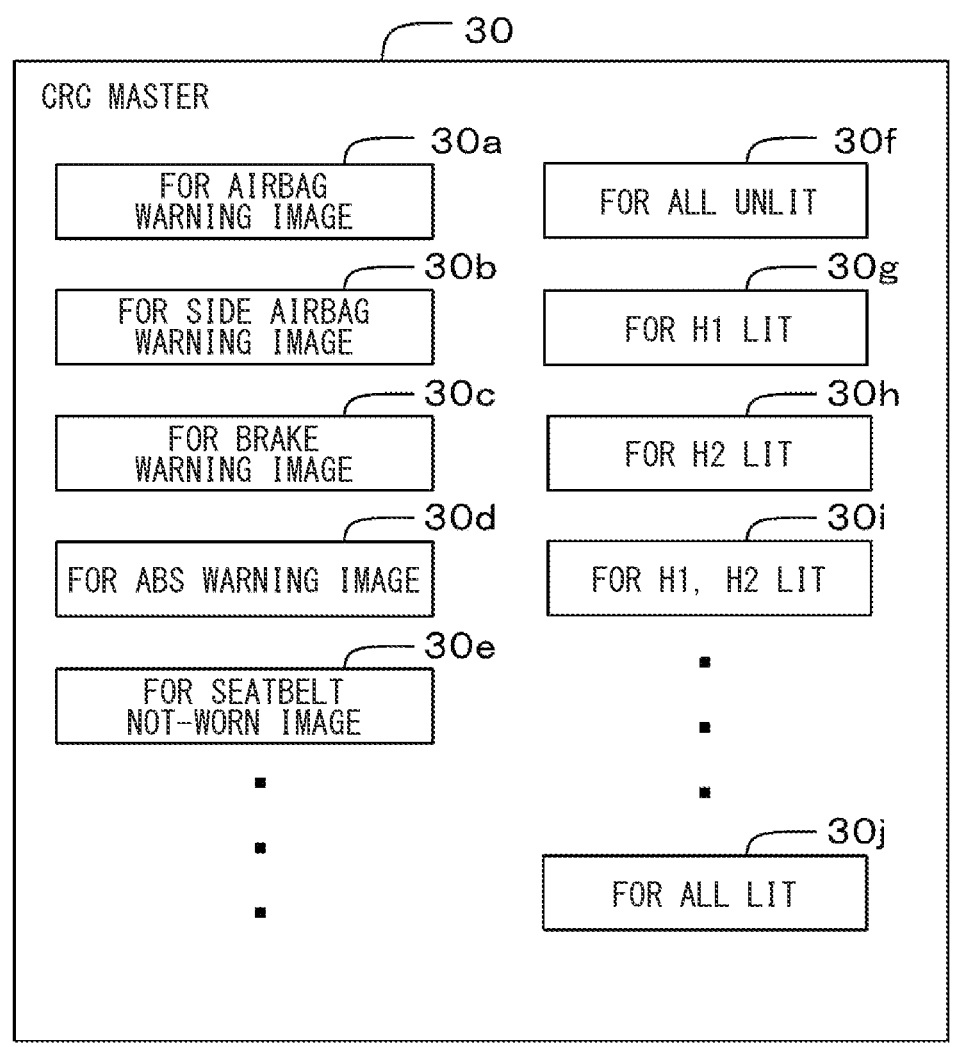
FIG. 7 is a diagram schematically showing an example of the CRC master according to a second embodiment.

In the vehicular device 1 of the present embodiment, as shown in FIG. 7, in addition to the CRC master for the telltale image 31, the ROM 4 stores a CRC master 30 that is an error detection code calculated for the entire telltale display area (R). Hereinafter, the CRC master 30 calculated for the entire display area (R) may also be referred to as an area CRC master 30 for convenience, and the CRC master 30 calculated for the telltale image 31 may also be referred to as an image CRC master 30.

Figure 8:
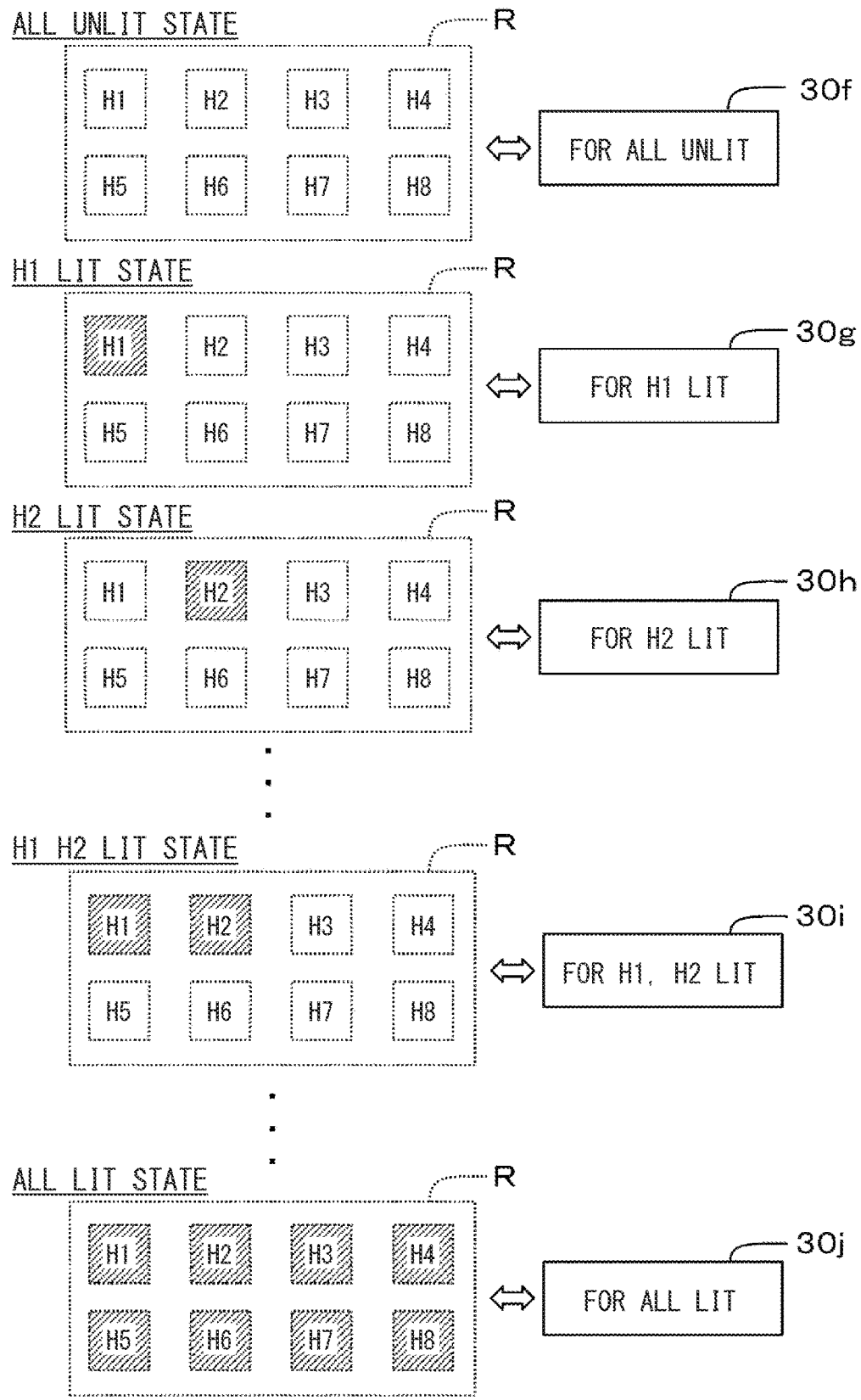
FIG. 8 is a diagram schematically showing a relationship between a display mode of a display area and the CRC master.

In the present embodiment, as shown in FIG. 8, eight telltale display positions H1 to H8 are set in the display area (R). At this time, each telltale is set to be lit or unlit according to the state of the vehicle, so the number of combinations of display modes of each telltale in the display area (R) is $2^8=256$. Therefore, the ROM 4 stores 256 area CRC masters 30 for the respective areas.

The area CRC master 30 for each of these areas is prepared (a) by making a video correctly displaying telltales in the lit or unlit state at designated display positions for each of the combinations in the above combination numbers in advance and (b) by performing CRC calculation on the display area (R) for each of the prepared videos.

For example, a CRC master 30$f$ corresponds to a state in which the telltales of all display positions (H1 to H8) are in the unlit state, as shown in FIG. 8 as for all unlit. Note that, in FIG. 8, hatching schematically shows that a telltale is in a lit state. Similarly, a CRC master 30$g$ corresponds to a state in which the telltale at the display position (H1) is in a lit state and the telltales at other display positions (H2 to H8) are respectively in an unlit state.

Also, a CRC master 30$h$ corresponds to a state in which the telltale at the display position (H2) is in a lit state and the telltales at the other display positions (H1, H3 to H8) are respectively in an unlit state. Also, a CRC master 30$i$ corresponds to a state in which the telltales at two display positions (H1, H2) are respectively in a lit state and the telltales at the other display positions (H3 to H8) are respectively in an unlit state. Also, a CRC master 30$j$ corresponds to a state in which the telltales at all display positions (H1 to H8) are respectively in an unlit state. Although not shown in FIGS. 7 and 8, the area CRC masters 30 for other combinations are also stored.

When detecting a video error, the vehicular device 1 obtains the SW-CRC in step S201 as shown in FIG. 6, and compares the obtained SW-CRC with the corresponding image CRC master 30 (S202), and upon having a match between the two (S202: YES), CRC calculation is performed on the entire display area (R) that includes a plurality of display positions (H1 to H8) in the output composed video, thereby the HW-CRC for the display area (R) is obtained. Thereafter, in step S204, the vehicular device 1 compares the obtained HW-CRC of the display area (R) with the area CRC master 30 identified based on the telltale information 20.

That is, in the present embodiment, the vehicular device 1 does not detect errors of the display state of each of the telltales individually, but collectively detects errors of the display content in the display area (R). In simpler terms, the vehicular device 1 collectively detects errors of the telltale itself and a mismatch of the telltale with the telltale information 20, that is, an error regarding the lit state and the unlit state.

Even with such a configuration, the vehicular device 1 can verify that the video output from itself is correctly generated based on the original image, and can detect errors in the video thereby exerting the same effects as the first embodiment.

In addition, by collectively performing error detection on the display area (R) as in the present embodiment, errors in the telltale video 21 itself and errors in the lit state and unlit state of the telltale can be collectively detectable, for quickly performing error detection.

Further, when collectively detecting an error for the display area (R), even in case that at least one of the telltale image 31 and the CRC master 30 has an error, such an error is finally detectable by comparing the generated telltale video 21 with the area CRC master 30.

Third Embodiment

The third embodiment is described in the following. The third embodiment differs from the first embodiment in that a plurality of semiconductor devices are used. However, since the configuration of each functional unit and the flow of processing for detecting an error are common, they are described with the same reference numerals.

Figure 9:
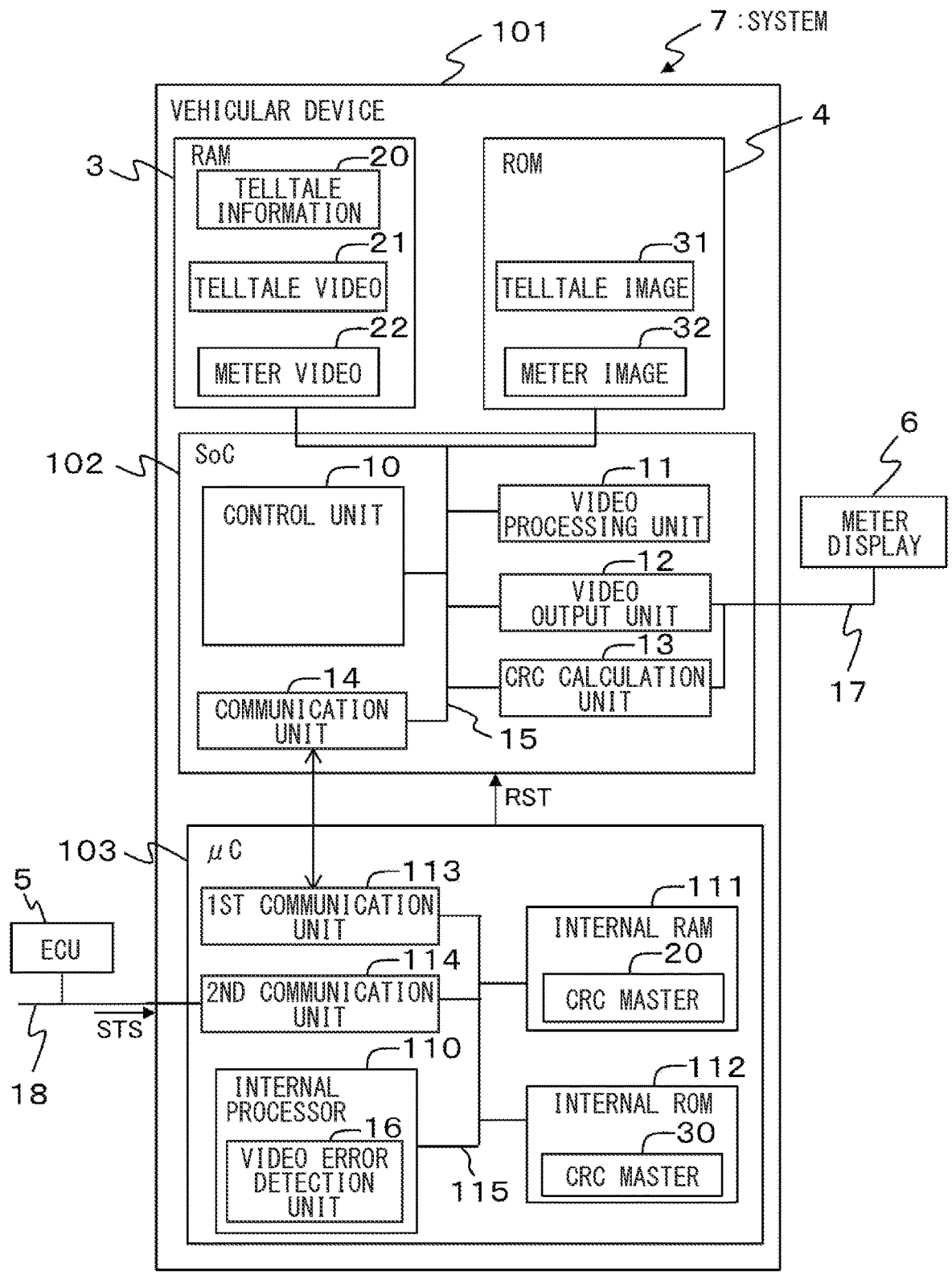
FIG. 9 is a diagram schematically showing a configuration example of a vehicular device according to a third embodiment.

As shown in FIG. 9, the vehicular device 101 of the present embodiment includes an SoC 102 as a first semiconductor device and a µC 103 as a second semiconductor device. The SoC 102 is basically the same as the SoC 2 of the first embodiment, but does not include the video error detection unit 16. Also, the CRC master 30 is not stored in the ROM 4 connected to the SoC 102. This ROM 4 constitutes a storage unit of the first semiconductor device.

The µC 103 is a so-called microcomputer, and includes a internal processor 110, a internal RAM 111, a internal ROM 112, a first communication unit 113, a second communication unit 114, and the like. µC is an abbreviation of microcomputer. The video error detection system 7 is constructed by these SoC 102, µC 103, and the like.

The internal processor 110 includes a CPU (not shown), and is connected to the internal RAM 111, the internal ROM 112, the first communication unit 113 and the second communication unit 114 via an internal bus 115. The internal processor 110 implements at least part of the functions of the video error detection unit 16 by software by executing a program. The video error detection unit 16 has a function common to that of the first embodiment, and detects errors in the video output to the display device.

The internal processor 110 also outputs an RST signal that resets the SoC 102 when an error is detected. This RST signal can employ a configuration in which it is output by GPIO, for example. RST is an abbreviation of reset, and GPIO is an abbreviation of General-Purpose Input/Output.

The internal RAM 111 is realized by a volatile storage device built in µC, and temporarily stores various data related to the processing executed by the internal processor 110, the vehicle status including the telltale information 20 received from the ECU 5, and, specifically relevant in the present embodiment, the HW-CRC and the like received from the SoC 102.

The internal ROM 112 is realized by a non-volatile storage device such as a so-called FlashROM, eMMC, UFS, and the like, and stores programs to be executed by µC and, specifically relevant in the present embodiment, the CRC master 30. The internal ROM 112 constitutes a storage unit of the second semiconductor device.

The first communication unit 113 performs communication between the µC 103 and the SoC 102. This first communication unit 113 receives instructions from the internal processor 110 to transmit the vehicle status to the SoC 102 and receive HW-CRC from the SoC 102. Though the first communication unit 113 can use any communication method as long as a band capable of communicating the vehicle status and HW-CRC at required intervals is available, the communication method of CAN, LIN, SPI, I2C, RS232C may be adopted.

The second communication unit 114 communicates with the ECU 5 via the in-vehicle network 18. The second communication unit 114 may have any configuration as long as a band capable of communicating the vehicle status at required intervals is available. That is, in the present embodiment, a semiconductor device for communication pre-installed in the vehicular device 101 is used. In such a manner, the hardware configuration is prevented from becoming excessively complicated.

Here, the technical significance of providing the SoC 102 and µC 103 is described. As described above, ISO26262 proposes ASIL as an index for evaluating hazards, and requires development at the design level to conform to the ASIL class. Further, in the first embodiment, a device corresponding to the ASIL class is selected as the SoC 102 in order to satisfy SG for the video output to the display device.

However, the types of semiconductor devices such as the SoC 102 that have internal functions for image processing and internal functions for CRC calculation are relatively limited, and the options of such devices are even more limited when requiring ASIL compliance. In addition, limited options lead to increased costs.

On the other hand, a device such as the µC 103 that does not have a functional unit related to image processing nor a functional unit related to CRC calculation, i.e., functions of which are limited to some extent, comes in various types compared to the SoC 102 even compliant with the required ASIL class, with many options, and in many cases, is relatively inexpensive compared to the SoC 102.

Therefore, in the present embodiment, the µC 103 is adopted as a device which has a required ASIL class of, for example, ASIL-B, and the µC 103 is in charge of the main function part for achieving SG, thereby, as the vehicular device 101 as a whole, achieving SG even with the SoC 102 that has, as one unit, an ASIL class of ASIL-A, which is lower than the required class.

Specifically, in the vehicular device 101 of the present embodiment, the SoC 102 and the µC 103 are communicably connected, and the control unit 10, the video processing unit 11, the video output unit 12, and the calculation unit are provided in the SoC 102, and the video error detection unit 16 is provided in the µC 103. The vehicular device 101 detects errors in the video by operating the SoC 102 and µC 103 in cooperation with each other.

Since an overall flow of processing for detecting video errors is the same as the first embodiment, the detailed description regarding such detection is omitted. However, it is specifically described that, in the vehicular device 101, when the µC 103 receives the vehicle status from the ECU 5, a data string is changed to have a suitable form for transmission to the SoC 102, and the data string is transmitted to the SoC 102 via the first communication unit 113, and the vehicle status is stored in the internal RAM 111 for comparison with the CRC master 30.

When the SoC 102 receives the data string, it executes the display processing shown in FIG. 5, obtains the vehicle status from the data string (S101), and stores the vehicle status including the telltale information 20 in the RAM 3 (S102). Then, the SoC 102 reads the telltale image 31 to generate the telltale video 21 (S103, S104), and reads the meter image 32 to generate the meter video 22 (S105, S106).

Subsequently, the SoC 102 composes a video from video components (S107), outputs the composed video (S108), performs CRC calculation on the composed video, obtains HW-CRC (S109), and then performs video error detection processing (S110). It should be noted that the flow of processing can be such that video error detection processing is executed first, and a composed video that has been verified to be correct is output.

The SoC 102 performs the video error detection processing shown in FIG. 6, performs CRC calculation on the telltale image 31 in the ROM 4, and obtains SW-CRC (S201).

After obtaining the SW-CRC, the Soc 102 compares the SW-CRC with the corresponding CRC master 30 to determine whether the two match (S202). By comparing the SW-CRC and the CRC master 30 in such manner, the correctness of both of the telltale image 31 read from the ROM 4 and the CRC master 30 stored in the internal ROM 112 can be verified, thereby guaranteeing the reliability of the verification result of the telltale video 21 using them.

Further, in case that the SW-CRC does not match the CRC master 30, the situation is understood that at least one of the telltale image 31 and the CRC master 30 has an error, that is, a current state is graspable as the one in which correctness of the generated telltale video 21 is not verifiable.

Therefore, when the SW-CRC and the CRC master 30 do not match (S202: NO), the SoC 102 determines SG violation (S205), and shifts the display mode to the safe side (S206).

In such case, the SoC 102 can be configured to shift the display mode to the safe side by (a) resetting itself, (b) instructing stop of video output to the meter display 6, or the like, as in the first embodiment. In such manner, display of an erroneous telltale is prevented, thereby avoiding SG violation. However, this configuration for shifting to the safe side is an example, and other configurations are possible as long as the state of SG violation can be suppressed.

On the other hand, when the SW-CRC and the CRC master 30 match (S202: YES), the SoC 102 transmits the HW-CRC obtained in step S109 to the µC 103 and the µC 103 performs the comparison with the HW-CRC. The µC 103 then compares the CRC master 30 with the received HW-CRC based on the telltale information 20 (S203), and determines whether the CRC master 30 and the SW-CRC match (S204). At this time, it is possible that the µC 103 determines matching with the image CRC master 30 pre-calculated for the individual telltale image 31 as described in the first embodiment, or determines matching with the area CRC master 30 pre-calculated for the display area (R) as described in the second embodiment.

Then, when the comparison result indicates unmatching for any telltale (S204: NO), the µC 103 determines SG violation (S205), and shifts the display mode to the safe side (S206). This is based on an idea that unmatching of the comparison result is caused by (a) a state in which, for example, the telltale image 31 stored in the RAM 3 is damaged and the telltale video 21 is erroneous because it is generated based on the damaged telltale image 31, or (b) a state in which the telltale is not displayed according to the vehicle status. In the present embodiment, the µC 103 resets the SoC 102 by outputting the RST signal to the SoC 102 to stop the display on the meter display 6, thereby shifting the display mode to the safe side.

Note that if the telltale image 31 stored in the ROM 4 is damaged, the HW-CRC of the video generated based on the damaged image will not match the CRC master 30, thereby video errors are similarly detectable. In other words, an error can be detected by comparing the display mode of the telltale in the output video and the state of the vehicle.

On the other hand, when the comparison result for each of the telltales indicates matching (S204: YES), the µC 103 determines, based on a fact (a) that the correct telltale video 21 is generated and (b) that each telltale is displayed in accordance with the vehicle status, that it is not SG violation and returns. In such case, it is guaranteed that the composed video satisfies SG.

Upon returning from the video error processing, i.e., it is determined as a state of no SG violation, the SoC 102 ends the display processing as shown in FIG. 5. For the sake of explanation, the flow for ending the processing is shown here, but in reality, the display processing is repeated based on the predetermined video update timing or obtainment of the vehicle status, or, the display processing stands by, waiting for the next update.

As described above, the vehicular device 101 performs the video error detection processing as cooperation of the SoC 102 and the µC 103 provided therein, on the composed video output from the video output unit 12, which is disposed in the final stage of processing in the device 101, for detecting errors that may lead to SG violation, and for verifying the correctness of the video output from the vehicular device 101.

According to the vehicular device 101 described above, the following effects are achievable. The vehicular device 101 includes the SoC 102 as a first semiconductor device, and the µC 103 as a second semiconductor device whose function is more limited than that of the first semiconductor device. Further, the vehicular device 101 communicably connects the first semiconductor device and the second semiconductor device, provides the control unit 10, the video processing unit 11, the video output unit 12, and the calculation unit in the first semiconductor device, and provides at least part of the function of the video error detection unit 16 in the second semiconductor device, for detecting the error of the video by the cooperation of the first semiconductor device and the second semiconductor device in cooperation with each other.

By adopting such a configuration, it is possible to expand the range of options for the SoC 102, which has to have a relatively-highly functionality in order to process the video, while configuring the vehicular device 101 to achieve SG as a whole. In addition, since freedom of choice of the options is widened, it is possible to make use of a relatively inexpensive device as the SoC 102.

On the other hand, regarding the µC 103, required functions are relatively limited to a certain extent, thereby allowing a wider range of options which are relatively inexpensive ones, as a device adoptable for the µC 103 as compared with the device for the SoC 102. Therefore, SG id achievable for the vehicular device 101 as a whole, and an excessive increase of cost is suppressible.

Also, by using the in-vehicular device 101 of the present embodiment, it is possible to verify that the video output from the device 101 is correctly generated based on the original image, and to detect errors in the video, i.e., achieving the same effects as the first embodiment.

Also, by using the vehicular device 101 of the present embodiment, errors in the telltale video 21 itself and errors in the lit state and unlit state of the telltale are collectively detectable by performing error detection for the entire display area (R), thereby achieving similar effects as those of the second embodiment, such as speedy error detection and the like.

Also, in the present embodiment, the SoC 102 is described as performing (a) the SW-CRC calculation and (b) the comparison with the CRC master 30. However, the µC 103 may perform these processes. In other words, the µC 103 may be provided with (a) functions of the video error detection unit 16 other than the comparison with the HW-CRC exemplified in the embodiment, or (b) all of the functions. In such case, the µC 103 may instruct the SoC 102 to perform CRC calculation and comparison, and may receive the calculation result and comparison result. Alternatively, it may adopt a configuration that (a) the µC 103 can use the CRC calculation unit 13, and (b) the µC 103 can make the CRC calculation unit 13 perform the SW-CRC calculation.

Also, the configuration of each embodiment described above can be modified, expanded, or combined, for example, as follows. Although the configuration in which one display area (R) is set is exemplified in the embodiment, the present disclosure is applicable to a configuration in which a plurality of display areas are set. In such case, as in the embodiment, it is possible to detect an error in the video by performing comparison with an error detection code calculated for each of the plurality of display areas. Further, it is possible to adopt a configuration in which an error in the video is detected by repeatedly performing the processing of comparing the error detection code with the calculated error detection code for the individual display positions by the number of telltales, for example.

Further, it may be configured that an error detection code as a master is obtained in advance for a plurality of display areas and stored in the ROM 4, and video error is detected by comparing the obtained master error detection code with the error detection code calculated for each of the plurality of display areas of the output video.

In the embodiments, an example of application to a configuration for detecting a video error in display on the meter display 6 has been shown. However, for example, it can be applied to a configuration for detecting a video error in the display on another display that displays a navigation screen. Further, for example, it is applicable to a configuration for detecting video errors in display on a telltales dedicated display device.

In the embodiments, the configuration using CRC calculation for calculation of the error detection code has been exemplified. However, as long as the identity of the input data is confirmable, any method is usable. The calculation unit is not limited to the CRC calculation unit 13 exemplified in the embodiment, and may have other configurations capable of calculating an error detection code. Note that MD5 is an abbreviation of Message Digest Algorithm 5, and SHA is an abbreviation of Secure Hash Algorithm.

In the embodiments, the flow of processing for determining SG violation based on a single error detection result has been exemplified. However, the flow of processing for determining SG violation may be based on redundancy, i.e., based on multiple detection results.

Although a soft error has been mainly described in the embodiments, the same can be used to detect systematic failures. That is, for example, when an erroneous telltale image 31 is stored in the ROM 4 or when the telltale image 31 itself has an error, an erroneous HW-CRC will always be calculated. Systematic faults such as storing a different image or corrupted image can be detected according to the present disclosure.

Although the present disclosure has been described in accordance with the embodiments, it is understood that the present disclosure is not limited to such embodiments or structures. The present disclosure includes variations and modifications within an equivalent range. In addition, various combinations and forms, and further, other combinations and forms including only one element, or more-than one or less than that are also within the sprit and the scope of the present disclosure.

The controllers (e.g., control units) and the method described in the present disclosure may be realized by a dedicated computer which is configured with a memory and a processor programmed to execute one or more particular functions embodied in computer programs. Alternatively, the controllers (e.g., control units) described in the present disclosure and the method thereof may be realized by a dedicated computer configured as a processor with one or more dedicated hardware logic circuits. Alternatively, the controllers (e.g., control units) and the method according to the present disclosure may be realized by using one or more dedicated computers constituted by a combination of the processor and the memory programmed to execute one or more functions and the processor with one or more hardware logic circuits. Further, the computer program may be stored as an instruction to be executed by the computer in a computer-readable, non-transitory, tangible recording medium.

What is claimed is:

1. A vehicular device, comprising:
a control unit executing a process related to displaying on a display device;
a video processing unit generating a video to be displayed on the display device;
a video output unit outputting the video generated by the video processing unit to the display device;
a storage unit storing an image that is a basis of the video generated by the video processing unit and an error detection code that has been calculated from the image;
a calculation unit calculating the error detection code; and
a video error detection unit detecting an error in the video output to the display device by comparing the error detection code calculated from the video output from the video output unit with the error detection code stored in the storage unit;
wherein the video error detection unit is configured to:
(A) verify correctness of both the image and the error detection code that are stored in the storage unit by comparing the error detection code calculated from the image stored in the storage unit with the error detection code stored in the storage unit, and
(B) further verify correctness by comparing (i) the correctness-verified error detection code and (ii) the error detection code calculated by the calculation unit from the image output by the video output unit.

2. The vehicular device of claim 1, wherein
the video error detection unit detects the error in the video including a telltale whose display mode is predetermined according to a state of the vehicle.

3. The vehicular device of claim 1, wherein
the video error detection unit detects, as the error, a mismatch between a display content of the output video and the state of the vehicle.

4. The vehicular device of claim 2, wherein
the video error detection unit detects the error in the video by comparing the error detection code stored in the storage unit with the error detection code calculated from an area of the video output from the video output unit where the telltale is displayed.

5. The vehicular device of claim 1, further comprising:
a first semiconductor device; and
a second semiconductor device whose function is more limited than that of the first semiconductor device, wherein
the first semiconductor device and the second semiconductor device are communicably connected to each other,
the first semiconductor device provides functions of the control unit, the video processing unit, the video output unit, and the calculation unit, and
the second semiconductor device provides at least part of a function of the error detection unit, and
the error in the video is detected by operating the first semiconductor device and the second semiconductor device in cooperation with each other.

6. The vehicular device of claim 1, wherein
the video error detection unit prevents an erroneous video being displayed on the display device if the error is detected in the video.

7. A vehicular device, comprising
at least one processor; and
at least one memory storing a program, wherein
by executing the program stored in the at least one processor, the at least one processor is configured to:
    execute a process related to displaying on a display device;
    generate a video to be displayed on the display device;
    output the generated video to the display device;
    store an image that is a basis of the generated video and an error detection code that has been calculated from the image;
    calculate the error detection code from the video output to the display device;
    compare the calculated error detection code with the stored error detection code to detect an error in the video output to the display device;
    verify correctness of both the image and the stored error detection code by comparing the error detection code calculated from the stored image with the stored error detection code; and
    further verify correctness by comparing (i) the correctness-verified error detection code and (ii) the error detection code calculated from the video output to the display device.

8. A method, comprising:
executing a process related to displaying on a display device;
generating a video to be displayed on the display device;
outputting the generated video to the display device;
storing an image that is a basis of the generated video and an error detection code that has been calculated from the image;
calculating the error detection code from the video output to the display device;
comparing the calculated error detection code with the stored error detection code to detect an error in the video output to the display device;
verify correctness of both the image and the stored error detection code by comparing the error detection code calculated from the stored image stored with the stored error detection code; and
further verify correctness by comparing (i) the correctness-verified error detection code and (ii) the error detection code calculated from the video output to the display device.

* * * * *